(12) United States Patent
Lansford et al.

(10) Patent No.: US 8,110,412 B2
(45) Date of Patent: Feb. 7, 2012

(54) INTEGRATED CIRCUIT WAFER SYSTEM WITH CONTROL STRATEGY

(75) Inventors: Christopher Hans Lansford, Austin, TX (US); Qinghua He, Auburn, AL (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/615,583

(22) Filed: Dec. 22, 2006

(65) Prior Publication Data

US 2008/0153180 A1    Jun. 26, 2008

(51) Int. Cl.
*H01L 21/00* (2006.01)
(52) U.S. Cl. .................................. 438/5; 257/E21.528
(58) Field of Classification Search ................... 438/5; 257/E21.528
See application file for complete search history.

(56) References Cited

U.S. PATENT DOCUMENTS

| 6,761,770 | B2 | 7/2004 | Bartholomew et al. |
| 6,821,825 | B2 | 11/2004 | Todd et al. |
| 6,958,253 | B2 | 10/2005 | Todd |
| 7,082,345 | B2 * | 7/2006 | Shanmugasundram et al. ............... 700/121 |
| 2006/0048702 | A1 * | 3/2006 | Son et al. ................. 117/94 |

* cited by examiner

*Primary Examiner* — Lex Malsawma
(74) *Attorney, Agent, or Firm* — Mikio Ishimaru

(57) ABSTRACT

An integrated circuit wafer system includes an integrated circuit wafer, measuring thicknesses of the integrated circuit wafer, calculating a change in temperature ramp rates and thickness offsets for subsequent processing based on the temperature ramp rates for prior processing and the resultant thicknesses, and calculating an average temperature and deposition time for subsequent processing based on calculated changes in temperature ramp rates, coupled with the average temperature, deposition time for prior processing, and the resultant thicknesses.

10 Claims, 3 Drawing Sheets

INTEGRATED CIRCUIT WAFER SYSTEM WITH CONTROL STRATEGY

TECHNICAL FIELD

The present invention relates generally to wafer systems, and more particularly to a system for an integrated circuit wafer control strategy.

BACKGROUND ART

Electronics devices, such as computer systems or cellular phones, have become an integral part of many daily activities. These electronic devices rely on microelectronics for the key functions and features. Microelectronic products, such as semiconductor chips, are typically fabricated with defined production flows but with multiple, similarly configured components such as chambers, tools, and modules (e.g., a grouping of tools) operated in parallel. The intention is that production flows processed on different combinations of components will each produce batches of identical products. Typically, each of these products is made by utilizing a multitude of recipes, where each recipe may be thought of as a set of predefined process parameters required to effectuate a processing outcome.

Wafer processing systems and methods are widely used in the manufacture of semiconductors and integrated circuits. One particular type of wafer processing system utilizes chemical vapor deposition (CVD) to deposit films or layers on the surface of a substrate as a step in the manufacture of semiconductors and integrated circuits. For example, films may be deposited using low-pressure CVD (LPCVD) systems, atmospheric pressure CVD (APCVD) systems, or different types of plasma enhanced CVD (PECVD) systems. In general, all such systems employ a deposition chamber where certain injected gaseous chemicals react and deposit a layer of material on the surface of the substrate. Many types of materials may be deposited, with dielectrics such as oxides and nitrides being typical examples.

An important criterion when depositing films is the thickness uniformity of the film. It is desirable to achieve a film of substantially uniform thickness over the entire surface of the substrate. This goal becomes more difficult for larger diameter substrates. The temperature of the processes within the chamber plays an important role in the resulting film thickness. Thus, it is desirable to control the temperature and to promote substantially uniform deposition over the entire surface of the substrate.

To improve within-wafer uniformity with a fixed-temperature recipe for a batch-furnace CVD process, there are two common approaches. (1) Lower the average temperature of the process, improving uniformity at the expense of tool throughput, since lower-temperature recipes are generally much slower. (2) Increase the distance between wafers in the furnace, also reducing tool throughput, since fewer wafers could fit on the boat for each run.

Most LPCVD recipes keep the temperature target for a given furnace zone fixed during deposition in an effort to minimize variability. However, because the heater elements that heat the furnace are located outside the outer radius of the wafers, if the temperature changes, the change is effected first at the outer edge of the wafer. Thus, if the temperature at the heater element is ramped down during deposition, the cumulative deposition rate at the wafer edge decreases more than that at the wafer center. This allows one to modify the radial thickness profile of a film by changing the rate at which the temperature ramps, compensating for factors like gas depletion that generally give rise to within-wafer thickness variation.

Since the rate of the temperature ramp is proportional to the magnitude of the thickness profile change, one can adjust the temperature ramp rate to compensate for changes in radial thickness profile, regardless of its source. This sort of process adjustment conventionally requires a test run to confirm that ramp rate changes have the desired effect on uniformity. Since ramp rate changes affect the across-furnace variation as well as the within-wafer variation, multiple test run iterations are often required to adequately "tune" a ramped-temperature process. Furnace conditions can drift over time or change abruptly due to maintenance, which would require a new round of test runs to retarget the process, negatively impacting tool availability.

Thus, a need still remains for a wafer system to improve wafer uniformity without requiring extensive, non-productive test runs. In view of the ever-increasing commercial competitive pressures, coupled with the technical imperatives of improved die-to-die variation and improved production efficiency, it is critical that answers be found for these problems. Competitive pressures also demand lower costs alongside improved efficiencies and performance.

Solutions to these problems have been sought but prior developments have eluded those skilled in the art.

DISCLOSURE OF THE INVENTION

The present invention provides an integrated circuit wafer, measuring thicknesses of the integrated circuit wafer, calculating a change in temperature ramp rates and thickness offsets for subsequent processing based on the temperature ramp rates for prior processing and the resultant thicknesses, and calculating an average temperature and deposition time for subsequent processing based on calculated changes in temperature ramp rates, coupled with the average temperature, deposition time for prior processing, and the resultant thicknesses.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
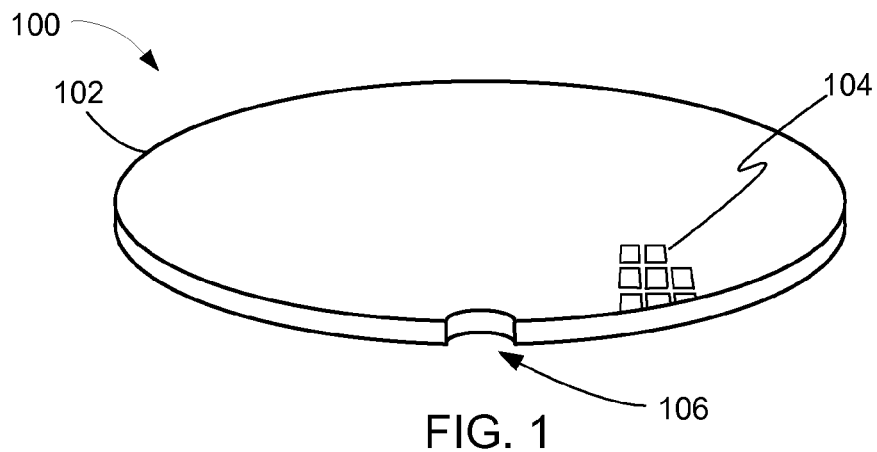
FIG. 1 is an isometric view of an integrated circuit wafer system in an embodiment of the present invention.

The following embodiments are described in sufficient detail to enable those skilled in the art to make and use the invention. It is to be understood that other embodiments would be evident based on the present disclosure, and that system, process, numerical, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, mathematics, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the invention, regardless of its orientation. The term "vertical" refers to a direction perpendicular to the horizontal as just defined. Terms, such as "on" "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown an isometric view of an integrated circuit wafer system 100 in an embodiment of the present invention. The integrated circuit wafer system 100 includes integrated circuit wafers 102 having integrated circuit die 104. The integrated circuit wafers 102 and the integrated circuit die 104 are formed having a predetermined thickness. The predetermined thickness includes films (not shown), such as a thin nitride film, that are formed, such as by low-pressure chemical vapor deposition, over the integrated circuit wafers 102.

Improving uniformity, such as thickness range or variation, of film thicknesses provides narrowing parametric distributions, increasing die yield, and allowing larger wafer batch sizes. Improved uniformity can be wafer-to-wafer, which denotes sites on one wafer and sites on another wafer, or within-wafer, which denotes different sites on a same wafer. For illustrative purposes, the integrated circuit wafer system 100 is shown having five full patterns of the integrated circuit die 104, although it is understood that any number of the integrated circuit die 104 may be included.

It has been discovered that the integrated circuit wafer system 100 improved within-wafer thickness distribution as well as wafer-to-wafer thickness distribution and batch-average targeting.

Figure 2:
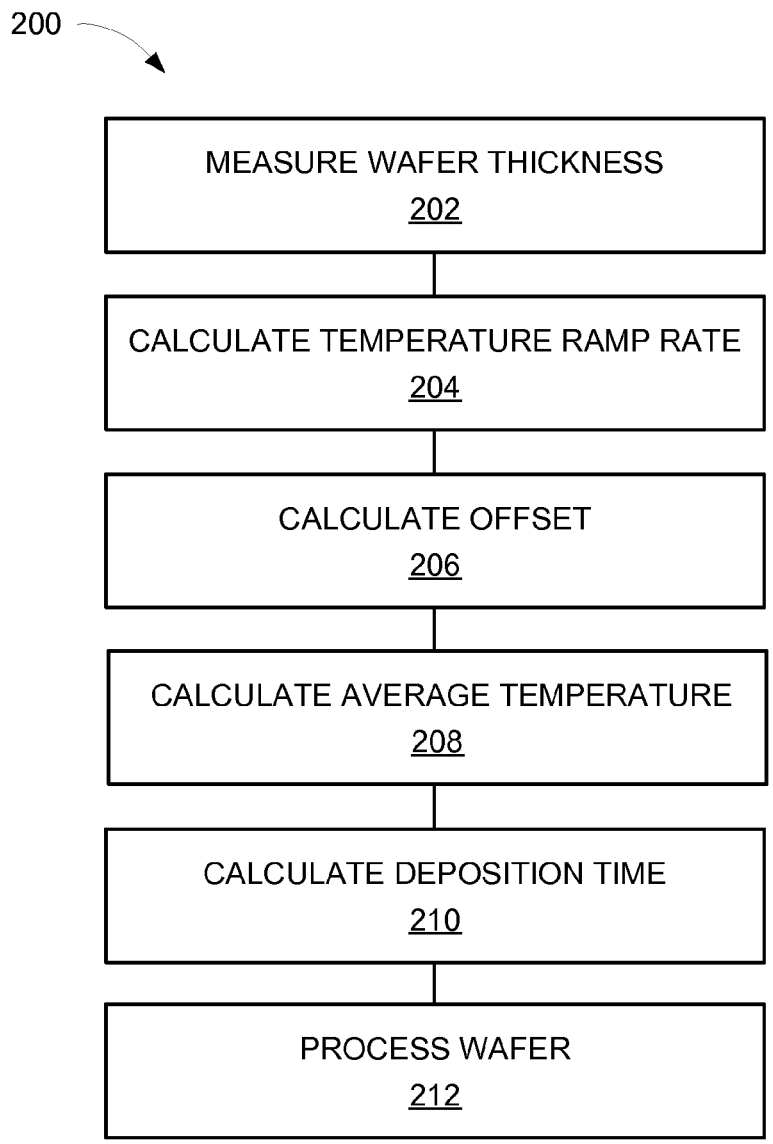
FIG. 2 is a flow chart of a run-to-run control process for manufacturing the integrated circuit wafer system in an embodiment of the present invention.

Referring now to FIG. 2, therein is shown a flow chart of a run-to-run control process 200 of the integrated circuit wafer system 100 in an embodiment of the present invention. The within-wafer uniformity of a process, such as batch furnace LPCVD, is dependent on many parameters such as temperature, gas concentrations, pressure, and substrate composition. Of these, temperature is often the most critical. The integrated circuit wafer system 100 can include several processes such as measuring, comparing, calculating, adjusting, or depositing.

A block 202 of the run-to-run control process 200 includes measuring the thickness of multiple sites on multiple wafers from a batch of wafers processed together using an apparatus, such as a furnace.

A block 204 of the run-to-run control process 200 includes calculating an optimal change in temperature ramp rates, from thickness profiles of the wafers of the block 202, for each temperature zone.

A block 206 of the run-to-run control process 200 includes calculating the predicted effect on average thickness, such as thickness offsets, from the new temperature ramp rates of the block 204 that are predicted to optimize within-wafer uniformities.

A block 208 of the run-to-run control process 200 includes adjusting average thicknesses measured in the block 202 by the offsets calculated in the block 206, and calculating an average temperature, including temperature offsets, for each furnace zone to minimize the wafer-to-wafer variation.

A block 210 of the run-to-run control process 200 includes adjusting the average thicknesses measured in the block 202 by the offsets calculated in the block 206 and the block 208, and calculating a deposition time needed to make an average thickness for the whole batch reach the target thickness for the process.

A block 212 of the run-to-run control process 200 includes processing another batch with the temperature ramp rate calculated in the block 204, the average calculated in the block 208, and the deposition time calculated in the block 210. Further, as appropriate, return to the block 202, to repeat the run-to-run control process 200 by measuring thicknesses of multiple sites on multiple wafers from a subsequent batch of wafers processed together for producing a measured within-wafer thickness profile for multiple wafers.

Figure 3:
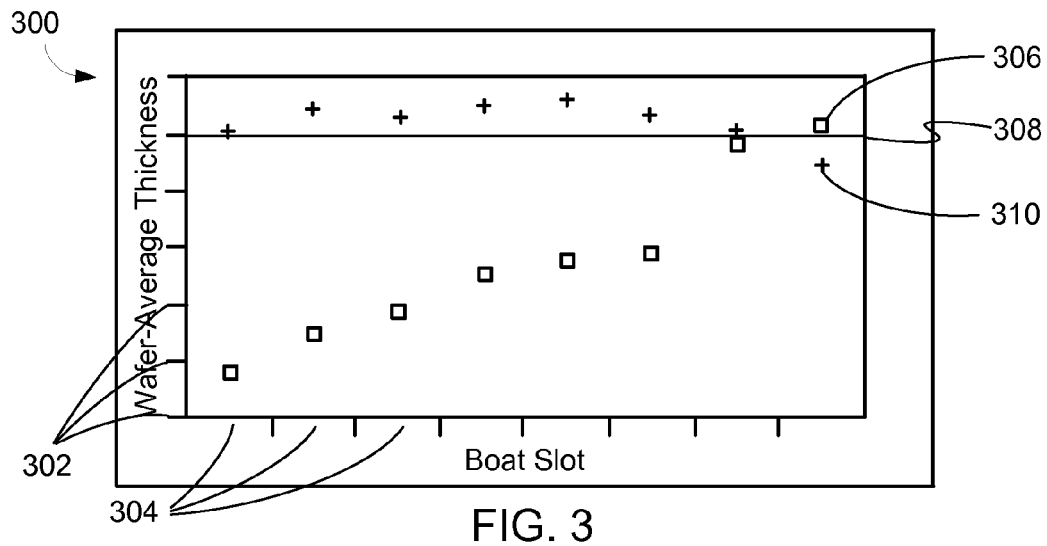
FIG. 3 is a graph of average thicknesses of the integrated circuit wafers.

Referring now to FIG. 3, therein is shown a graph of average thickness 300 of the integrated circuit wafers 102. As an example, wafers are formed having a thin nitride film. Wafer-average thickness 302 is plotted with wafers in boat slots 304. A poorly targeted test run is graphed by squares 306 having a target thickness 308. Using the run-to-run control process 200 of FIG. 2, results are graphed with cross symbols 310, and show improved wafer-to-wafer thickness. As an example, adjustments can be made to temperature ramp rates and average temperatures for multiple furnace zones, such as five furnace zones, as well as deposition time.

It has been discovered that the run-to-run control process 200 of the integrated circuit wafer system 100 dramatically improves wafer-to-wafer thickness.

Figure 4:
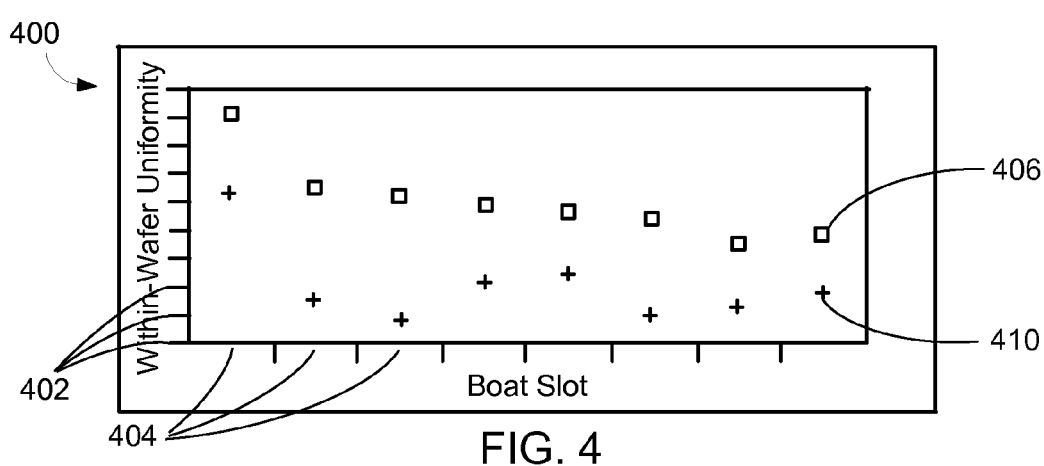
FIG. 4 is a graph of wafer uniformity of the integrated circuit wafers.

Referring now to FIG. 4, therein is shown a graph of wafer uniformity 400 of the integrated circuit wafers 102. As an example, the wafers are formed having a thin nitride film. Using similar data to the graph of FIG. 3, within-wafer uniformity 402 is plotted with wafers in boat slots 404. A poorly targeted test run is graphed by squares 406. Using the run-to-run control process 200 of FIG. 2, results are graphed with cross symbols 410, and show improved wafer-to-wafer uniformity. As an example, adjustments can be made to temperature ramp rates and average temperatures for multiple furnace zones, such as five furnace zones, as well as deposition time.

It has been discovered that the run-to-run control process 200 of the integrated circuit wafer system 100 dramatically improves wafer-to-wafer uniformity.

Figure 5:
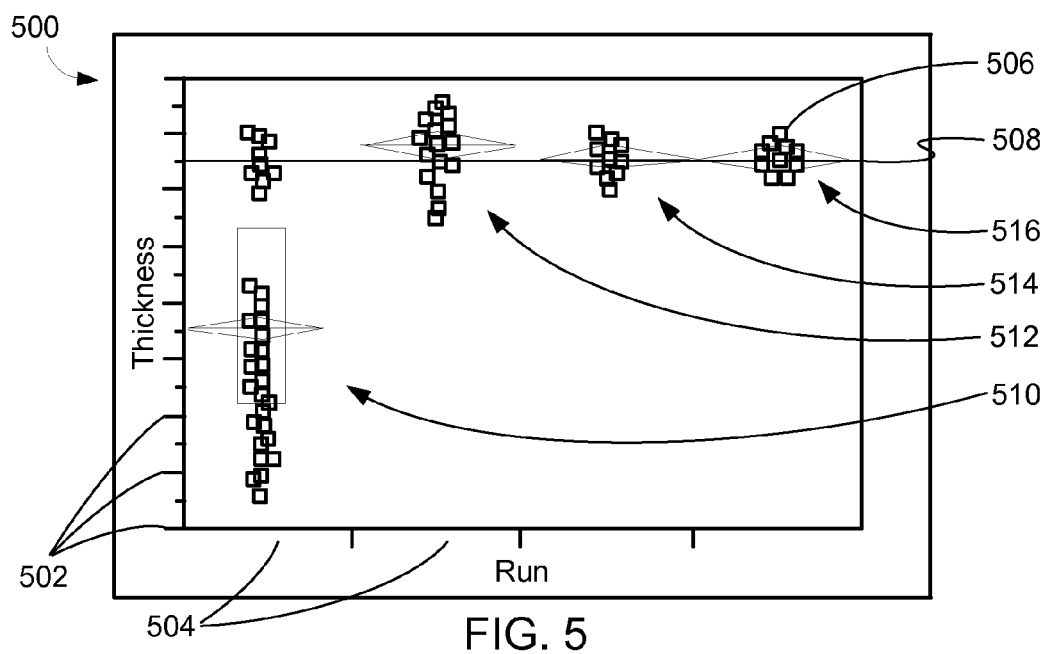
FIG. 5 is a graph of wafer thicknesses 500 of the integrated circuit wafers.

Referring now to FIG. 5, therein is shown a graph of wafer thicknesses 500 of the integrated circuit wafers 102. As an example, wafers are formed having a thin nitride film. Using similar data to the graphs of FIGS. 3 and 4, wafer thickness 502 is plotted with processing runs 504. The wafer thickness 502 includes all-sites data, such as within-wafer thickness. Using the run-to-run control process 200 of FIG. 2, results are graphed with squares 506 and show improved distribution, about a target 508, between one of the processing runs 504 and a previous of the processing runs 504.

The all-sites data of a first distribution 510 of the processing runs 504 depicts poorly targeted all-sites data with significant range. A second distribution 512 of the processing runs 504 depicts improved targeting and a range of about twenty-seven percent of the range of the first distribution 510. A third distribution 514 depicts further improved targeting and a range of about thirty-three percent of the range of the second distribution 512. A fourth distribution 516 depicts improved targeting and a range of about ninety percent of the range of the third distribution 514 or about eight percent of the range of the first distribution 510.

It has been discovered that the run-to-run control process 200 of the integrated circuit wafer system 100 dramatically improves within-wafer thickness and uniformity.

Figure 6A:
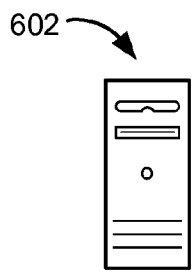
FIGS. 6A, 6B, and 6C are schematic views of electronics systems as examples in which various aspects of the present invention can be implemented.
Figure 6B:
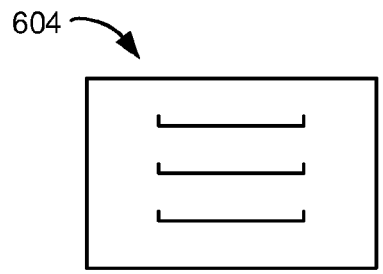
Figure 6C:
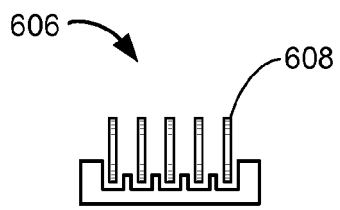

Referring now to FIGS. 6A, 6B, and 6C therein are shown schematic views of systems as examples in which various aspects of the present invention can be processed. A calculating system 602, such as a computer system, can provide thickness profiles, optimal change in temperature ramp rates, predicted effect on average thickness, adjusted average thicknesses, average temperatures, and deposition time. A processing system 604, such as a furnace, an annealing system, a deposition system, or a combination thereof, can provide further processing, such as deposition or annealing. A containing system 606, such as a wafer boat, can provide substantially fixed positions for integrated circuit wafers 608 for handling, processing or transporting.

As an example, the containing system 606, including the integrated circuit wafers 608, can be transported to the processing system 604. The calculating system 602 can control the processing system 604 for film deposition or thermal annealing, of the integrated circuit wafers 608. Based on the type of process, the containing system 606 can optionally contain the wafers in the processing system 604. The calculating system 602 can further control the processing system 604 to remove the integrated circuit wafers 608 or optionally the containing system 606, including the integrated circuit wafers 608, from the processing system 604.

Figure 7A:
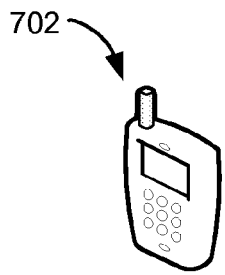
FIGS. 7A, 7B, and 7C are shematic views of electronics systems as examples in which various aspects of the present invention can be implemented.
Figure 7B:
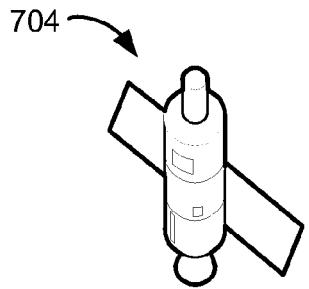
Figure 7C:
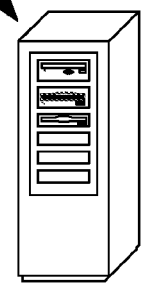

Referring now to FIGS. 7A, 7B, and 7C therein are shown schematic views of electronics systems as examples in which various aspects of the present invention can be implemented. The electronics systems can be any system performing any function including data: creation, transportation, transmittal, modification, storage, or combination thereof. Any of the electronics systems can include one or more subsystems, such as printed circuit boards, substrates or other electronic assemblies.

As examples, the electronics systems such as a cellular phone 702, a satellite 704, and a computer system 706 can include an integrated circuit having the present invention. For example, information created, transported, or stored on the cellular phone 702 can be transmitted to the satellite 704. Similarly, the satellite 704 can transmit or modify the information to the computer system 706 wherein the information can be stored, modified, or transmitted by the computer system 706.

Figure 8:
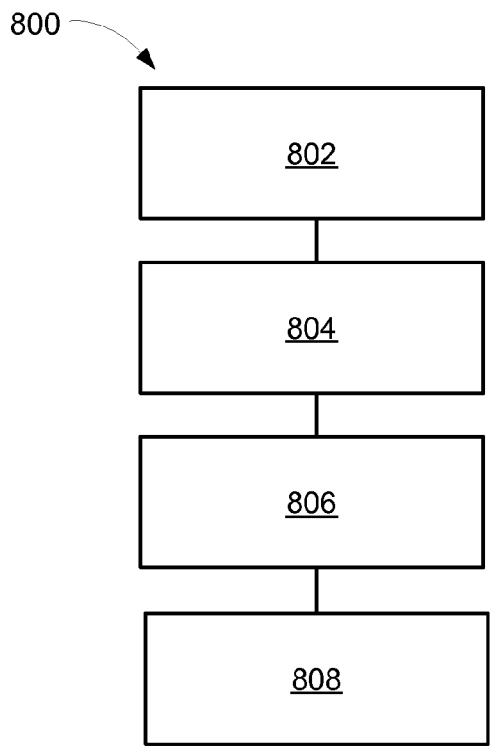
FIG. 8 is a flow chart of an integrated circuit wafer system for manufacturing the integrated circuit wafer system in an embodiment of the present invention.

Referring now to FIG. 8, therein is shown a flow chart of an integrated circuit wafer system 800 for manufacturing the integrated circuit wafer system 100 in an embodiment of the present invention. The system 800 includes providing an integrated circuit wafer in a block 802; measuring thicknesses of the integrated circuit wafer in a block 804; calculating a change in temperature ramp rates and thickness offsets for subsequent processing based on the temperature ramp rates for prior processing and the resultant thicknesses in a block 806; and calculating an average temperature and deposition time for subsequent processing based on calculated changes in temperature ramp rates, coupled with the average temperature, deposition time for prior processing, and the resultant thicknesses in a block 808.

In greater detail, a system to provide the method and apparatus of the integrated circuit wafer system 100, in an embodiment of the present invention, is performed as follows:

1. Providing integrated circuit wafers. These could be patterned production wafers or unpatterned test wafers.
2. Measuring thicknesses of the integrated circuit wafers.
3. Calculating a change in temperature ramp rates for subsequent processing from the measured within-wafer thickness profiles produced in prior processing.
4. Calculating thickness offsets for subsequent processing from the change in the temperature ramp rates calculated in step 3.
5. Calculating an average temperature for subsequent processing for each controllable temperature zone from the thicknesses measured in step 2 and from the temperature ramp rates calculated in step 3.
6. Calculating a deposition time from the thicknesses from prior processing measured in step 2, the temperature ramp rate calculated in step 3, the thickness offset calculated in step 4, and the average temperature calculated in step 5.
7. Processing another batch of integrated circuit wafers with the temperature ramp rates, average temperatures, and deposition times calculated in steps 3, 5, and 6, respectively.

The present invention thus has numerous aspects of different embodiments.

An aspect of different embodiments of the present invention is a control strategy. Since furnace conditions can drift over time or change abruptly due to maintenance, this invention discloses a control strategy that effectively tunes a ramped-temperature process on a run-to-run basis. The use of a run-to-run control strategy also avoids the need for costly and inefficient test runs and results in tighter thickness distributions than possible either with a fixed-temperature process or with a ramped-temperature process that is tuned solely by intermittent test runs.

Another aspect of different embodiments of the present invention is the distinct advantage over other options in that it does not appreciably reduce the tool throughput. In fact, it could be used in conjunction with a higher temperature recipe or with a tighter-pitched boat, greatly improving tool throughput. Using the improved uniformity enabled by this control strategy can compensate for a process change that would otherwise have unacceptably increased the thickness distribution (e.g., moving from a 75-wafer load size to a 100-wafer load size).

Yet another aspect of different embodiments of the present invention is that relative to other ramped-temperature approaches, the proposed run-to-run control method has the important advantage that no dedicated test runs are required to tune the system. All the model inputs are collected in the normal course of measuring thickness results from normal production runs—so there again is an advantage in tool utilization.

Yet another important aspect of different embodiments of the present invention is that it valuably supports and services the historical trend of reducing costs, simplifying systems, and increasing performance.

These and other valuable aspects of different embodiments of the present invention consequently further the state of the technology.

Thus, it has been discovered that the integrated circuit wafer system method and apparatus of the present invention furnish important and heretofore unknown and unavailable solutions, capabilities, and functional aspects for integrated circuit wafer systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for forming an integrated circuit wafer system comprising:
   providing an integrated circuit wafer;
   measuring thicknesses of the integrated circuit wafer;
   calculating a change in temperature ramp rates and thickness offsets to optimize within-wafer uniformities during subsequent processing based on the temperature ramp rates for prior processing and the thicknesses; and
   calculating an average temperature and deposition time to minimize wafer-wafer variation during subsequent processing based on the change in temperature ramp rates, coupled with the average temperature, deposition time for prior processing, and the thicknesses.

2. The method as claimed in claim 1 further comprising processing another integrated circuit wafer.

3. The method as claimed in claim 1 wherein calculating the change in temperature ramp rates includes providing a profile of the thicknesses.

4. The method as claimed in claim 1 wherein calculating the average temperature includes adjusting average thicknesses.

5. The method as claimed in claim 1 wherein calculating the deposition time includes adjusting average thicknesses.

6. A method for forming an integrated circuit wafer system comprising:
   providing integrated circuit wafers having a film;
   measuring thicknesses of the integrated circuit wafers for producing measured within-wafer thickness profiles;
   calculating a change in temperature ramp rates to optimize within-wafer uniformities during subsequent processing based on the measured within-wafer thickness profiles;
   calculating thickness offsets for subsequent processing based on the change in the temperature ramp rates;
   calculating an average temperature to minimize wafer-wafer variation during subsequent processing, including temperature offsets, based on the thicknesses and the temperature ramp rates;
   calculating a deposition time for subsequent processing based on the thicknesses, the temperature ramp rates, the thickness offsets, and the average temperature; and
   processing another batch of integrated circuit wafers with the temperature ramp rates, the average temperature, and the deposition time.

7. The method as claimed in claim 6 wherein measuring thicknesses includes measuring thicknesses of multiple sites of multiple wafers.

8. The method as claimed in claim 6 wherein calculating the change in the temperature ramp rates includes calculating the change in the temperature ramp rates based on a profile of the thicknesses.

9. The method as claimed in claim 6 wherein calculating the average temperature includes adjusting average thicknesses by the thickness offsets.

10. The method as claimed in claim 6 wherein calculating the deposition time includes adjusting average thicknesses by the thickness offsets and the temperature offsets.

* * * * *